(12) United States Patent
Amirkiai et al.

(10) Patent No.: US 8,721,193 B2
(45) Date of Patent: May 13, 2014

(54) ELECTRONIC MODULE HAVING MULTIPLE FLEX CIRCUIT CONNECTORS

(75) Inventors: Maziar Amirkiai, Sunnyvale, CA (US); Hongyu Deng, Saratoga, CA (US)

(73) Assignee: Finisar Corporation, Sunnyvale, CA (US)

( * ) Notice: Subject to any disclaimer, the term of this patent is extended or adjusted under 35 U.S.C. 154(b) by 532 days.

(21) Appl. No.: 12/855,911

(22) Filed: Aug. 13, 2010

(65) Prior Publication Data
US 2012/0039572 A1    Feb. 16, 2012

(51) Int. Cl.
*G02B 6/42*    (2006.01)
*H04B 10/00*    (2013.01)

(52) U.S. Cl.
USPC .............. 385/92; 398/135; 398/182; 398/202

(58) Field of Classification Search
None
See application file for complete search history.

(56) References Cited

U.S. PATENT DOCUMENTS

| | | | |
|---|---|---|---|
| 2005/0007741 A1 | 1/2005 | Ice et al. | |
| 2005/0036747 A1* | 2/2005 | Togami et al. | ................. 385/92 |
| 2005/0045981 A1* | 3/2005 | Wang et al. | ................. 257/432 |
| 2005/0162761 A1 | 7/2005 | Hargis et al. | |
| 2005/0244111 A1 | 11/2005 | Wolf et al. | |
| 2007/0116478 A1 | 5/2007 | Chen | |

FOREIGN PATENT DOCUMENTS

| | | |
|---|---|---|
| JP | 2005-019717 | 1/2005 |
| JP | 2007-155863 | 6/2007 |

OTHER PUBLICATIONS

International Search Report and Written Opinion mailed Feb. 27, 2012 in related PCT Application No. PCT/US2011/047665.

* cited by examiner

*Primary Examiner* — Jerry Rahll
(74) *Attorney, Agent, or Firm* — Maschoff Brennan

(57) ABSTRACT

In one example embodiment, an electronic module comprises a plurality of components and flex circuit connectors each electrically connected to respective components of the electronic module. The electronic module may be an optical subassembly of an optical transceiver. Moreover, one of the flex circuit connectors may be physically connected to another of the flex circuit connectors.

23 Claims, 8 Drawing Sheets

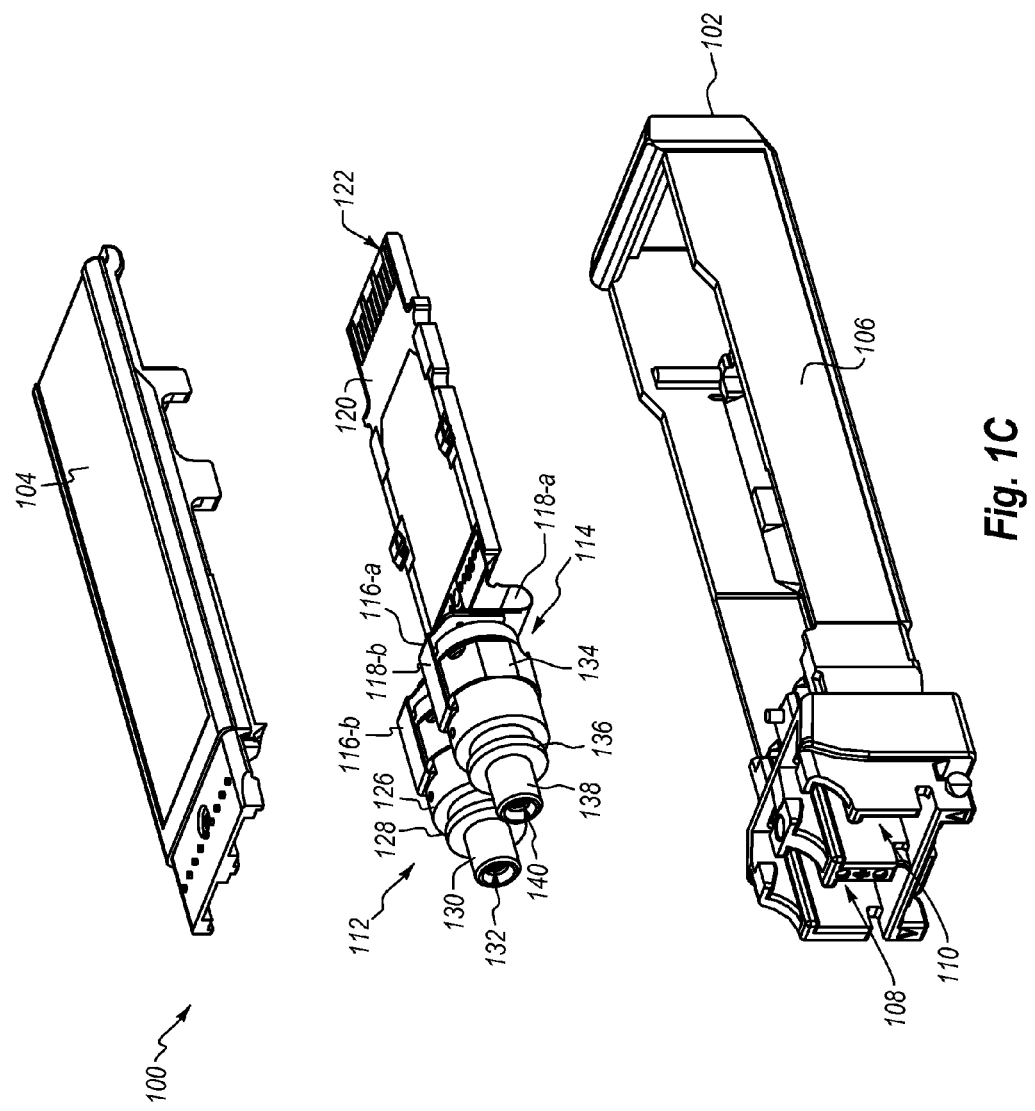

ELECTRONIC MODULE HAVING MULTIPLE FLEX CIRCUIT CONNECTORS

BACKGROUND

Electronic modules, such as electronic or optoelectronic transceiver or transponder modules, are increasingly used in modern technology. An electronic module will typically include various components (e.g., discrete elements, microchips, integrated circuits, input/output interfaces, etc.) connected in various ways to one another. For example, many components can be interconnected by surface-mounting them to a printed circuit board (PCB) having electrical traces embedded therein that provide the appropriate interconnections. To accommodate interfaces with other electronic modules or input/output transmission lines, other forms of component interconnection may be required. For example, electrical lines, such as wires, may need to extend from a PCB to another PCB or to another electronic module (e.g., an optoelectronic transducer) that is not mounted to the PCB. The electrical lines extending from a PCB will tend to be bulkier, flimsier, more lossy, and will tend to introduce and be susceptible to more electromagnetic interference (EMI), among other things, than other forms of interconnection, such as the traces embedded in the PCB.

Moreover, an improvement or change made to the electronic module might entail use of additional electrical lines. For example, a first electronic module connected to the PCB might be improved by integrating a second electronic module with the first electronic module. Furthermore, the second electronic module might require control or data signals from a microprocessor on the PCB. The same issues (e.g., bulk, loss, EMI, etc.) that arise in connection with the electrical lines for the first electronic module must also be faced in connection with electrical lines used to provide control or data signals to the second electronic module. Moreover, the first electronic module's interface may be a set of leads or pins conforming with a standard pin-out interface and may not have sufficient room to accommodate such new electrical lines. Thus, interconnecting the PCB to an improved electronic module presents various challenges.

BRIEF SUMMARY

In general, example embodiments of the invention relate to electronic modules comprising a plurality of components and flex circuit connectors each electrically connected to respective components of the electronic module.

In one example embodiment, the electronic module comprises two components and two corresponding flex circuit connectors electrically connected to the respective components. Moreover, one of the flex circuit connectors may be physically connected to another of the flex circuit connectors.

In another example embodiment, the electronic module comprising a plurality of components and corresponding flex circuit connectors is an optical subassembly of an optical transceiver. Moreover, at least one of the components may be an optical component and another at least one of the components may be a variable optical attenuator or a thermoelectric cooler.

In another example embodiment, a method of assembling an electronic module comprising a plurality of stages. The method includes electrically coupling a first end of a first flex circuit connector to a printed circuit board. A second end of the first flex circuit connector is then electrically coupled to a plurality of pins extending from a subassembly of electronic components. Next, the method includes electrically coupling a first end of a second flex circuit connector extending out of the subassembly of electronic components to the second end of the first flex circuit connector. The second end of the second flex circuit connector is electrically coupled to an electronic component housed within the subassembly of electronic components.

Additional features of the invention will be set forth in the description which follows, and in part will be obvious from the description, or may be learned by the practice of the invention. The features of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

To further clarify the above and other features of the present invention, a more particular description of the invention will be rendered by reference to specific embodiments thereof which are illustrated in the appended drawings. It is appreciated that these drawings depict only typical embodiments of the invention and are therefore not to be considered limiting of its scope. The invention will be described and explained with additional specificity and detail through the use of the accompanying drawings in which:

FIGS. 1A-1C disclose aspects of an example optoelectronic transceiver module;

DETAILED DESCRIPTION OF EXAMPLE EMBODIMENTS

Example embodiments of the present invention relate to electronic modules including, e.g., optical assemblies ("OSAs"), such as transmitter optical assemblies ("TOSAs"), receiver optical assemblies ("ROSAs"), and optoelectronic transceiver modules having both a TOSA and a ROSA. Some electronic modules or OSAs can include multiple components, each connected to a printed circuit board ("PCB") via a separate flex circuit connector. One or more of the flex circuit connectors may connect to a PCB indirectly through another one or more of the flex circuit connectors. Aspects of example embodiments aid in connecting the various components of an OSA to a PCB in a reliable, efficient, and compact manner. Although embodiments described herein are primarily OSA embodiments, the principles of the invention are not limited to such embodiments and are instead more broadly applicable to any electronic module, optical or non-optical.

By the term "flexible circuit connector" or "flex circuit connector" as used herein is meant at least one thin flexible dielectric layer of material having circuitry as part thereof. By the term "thin" is meant an individual dielectric layer having a total thickness of from about 1 mils to about 8 mils, as part of a flex circuit connector having a total thickness from about 1.2 to about 30 mils, depending on the layer content. The circuitry will include a pattern of printed wiring or conductors typically including pads formed on a surface of the dielectric layer, in which case the conductors will have a thickness of from only about 0.2 to about 1 mil. Such circuitry is typically metallic, such as of a copper or copper alloy.

Reference will now be made to the drawings to describe various aspects of exemplary embodiments of the invention. It is to be understood that the drawings are diagrammatic and schematic representations of such exemplary embodiments, and are not limiting of the present invention, nor are they necessarily drawn to scale.

Figure 1A:
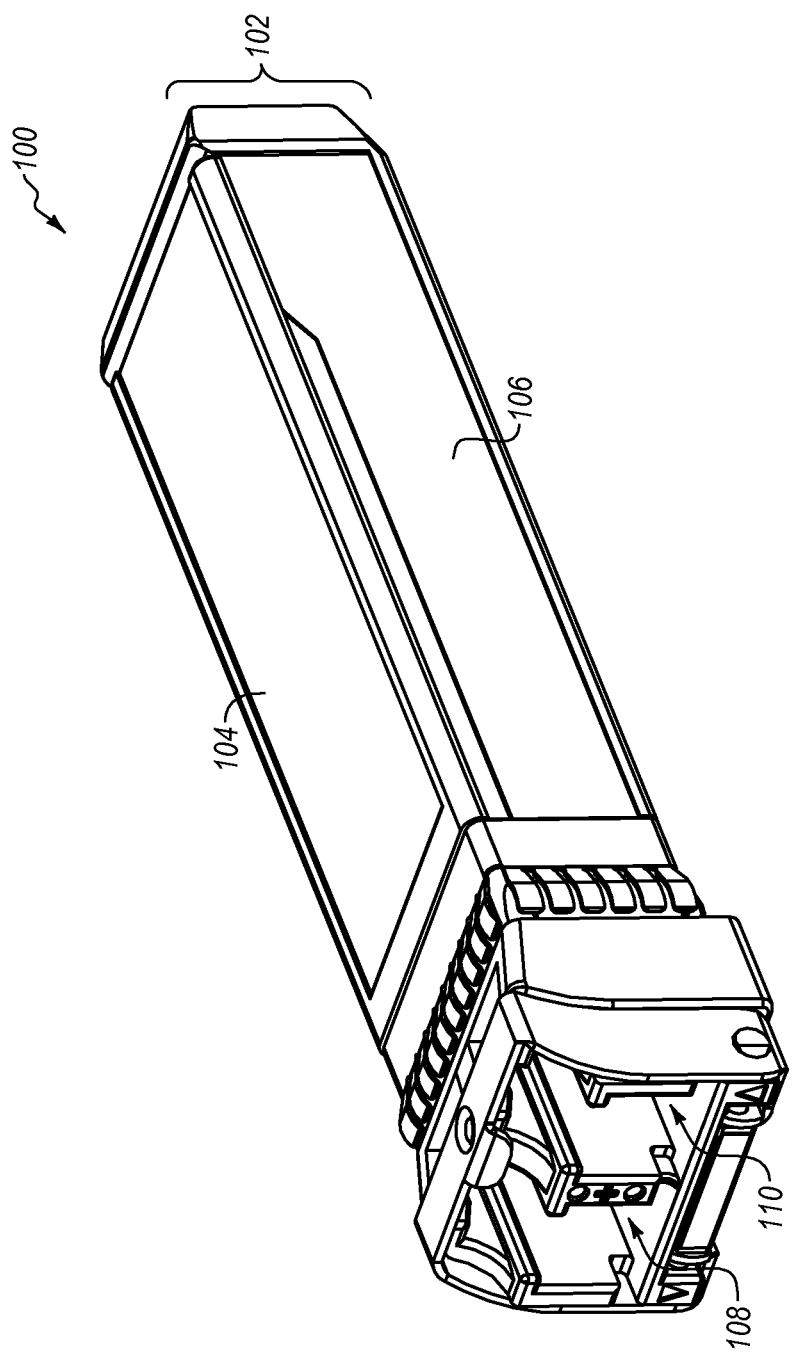
Figure 1B:
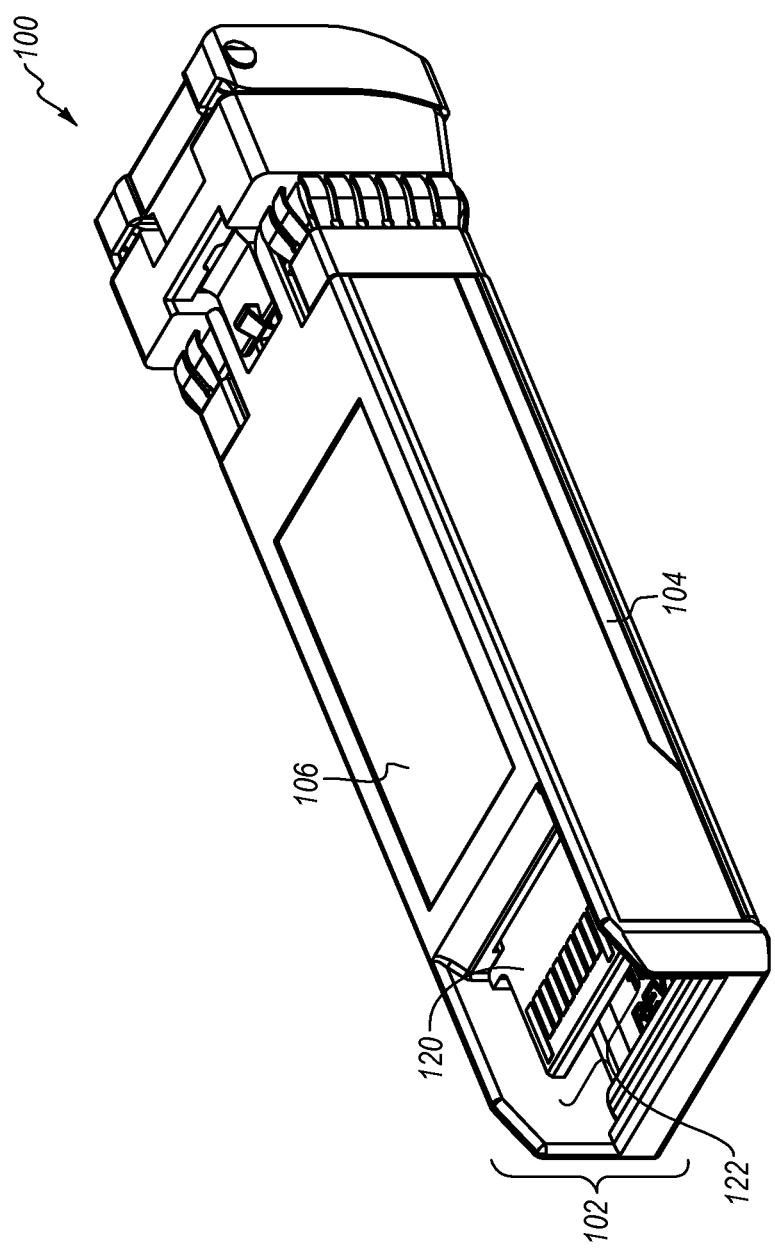

Reference is first made to FIGS. 1A-1C which disclose an example optoelectronic transceiver module 100 for use in transmitting and receiving optical signals in connection with a host device (not shown). As disclosed in FIGS. 1A and 1B, the optoelectronic transceiver module 100 includes various components, including a shell 102 that includes a rotatable top shell 104 and a bottom shell 106, and an output port 108 and an input port 110 defined in the bottom shell 106. The rotatable top shell 104 and the bottom shell 106 can be formed using a die casting process. One example material from which the rotatable top shell 104 and the bottom shell 106 can be die cast is zinc, although the rotatable top shell 104 and the bottom shell 106 may alternatively be die cast from other suitable materials.

As disclosed in FIG. 1C, the example optoelectronic transceiver module 100 also includes a TOSA 112, a ROSA 114, flex circuit connectors 116-*a*, 116-*b*, 118-*a*, and 118-*b*, and a PCB 120 having an edge connector 122. The two flex circuit connectors 116-*a* and 118-*a* are used to electrically connect the TOSA 112 and the ROSA 114, respectively, to the PCB 120.

The TOSA 112 of the optoelectronic transceiver module 100 includes a barrel 126 within which an optical transmitter, such as a laser, (not shown) is disposed. The optical transmitter is configured to convert electrical signals received through the flex circuit connector 116-*a* and the PCB 120 from a host device (not shown) into corresponding optical signals. The TOSA 112 also includes a flange 128 and a nose piece 130. The nose piece 130 defines a port 132. The port 132 is configured to optically connect the optical transmitter disposed within the barrel 126 with a fiber-ferrule (not shown) disposed within the output port 108. The optoelectronic transceiver module 100 may also include various elements, such as a latching mechanism and an OSA positioning plate, which are not shown for clarity.

Similarly, the ROSA 114 of the optoelectronic transceiver module 100 includes a barrel 134, a flange 136, and a nose piece 138. The nose piece 138 defines a port 140. The port 140 is configured to optically connect an optical receiver, such as a photodiode (not shown), disposed within the barrel 134 to a fiber-ferrule (not shown) disposed within the input port 110. The optical receiver is configured to convert optical signals received from the fiber-ferrule into corresponding electrical signals for transmission to a host device (not shown) through the flex circuit connector 118-*a* and the PCB 120.

The optoelectronic transceiver module 100 can be configured for optical signal transmission and reception at a variety of per-second data rates including, but not limited to, 1 Gbit, 2 Gbit, 2.5 Gbit, 4 Gbit, 8 Gbit, 10 Gbit, or higher. Furthermore, the optoelectronic transceiver module 100 can be configured for optical signal transmission and reception at various wavelengths including, but not limited to, 850 nm, 1310 nm, 1470 nm, 1490 nm, 1510 nm, 1530 nm, 1550 nm, 1570 nm, 1590 nm, or 1610 nm. Further, the optoelectronic transceiver module 100 can be configured to support various transmission standards including, but not limited to, Fast Ethernet, Gigabit Ethernet, 10 Gigabit Ethernet, and 1×, 2×, 4×, and 10× Fibre Channel. In addition, although one example of the optoelectronic transceiver module 100 is configured to have a form factor that is substantially compliant with the small form-factor pluggable ("SFP") multi-source agreement ("MSA"), the optoelectronic transceiver module 100 can alternatively be configured to have a variety of different form factors that are substantially compliant with other MSAs including, but not limited to, the small form-factor ("SFF") MSA, the SFP plus MSA, or the 10 Gbit/s miniature device ("XMD") MSA.

Figure 2:
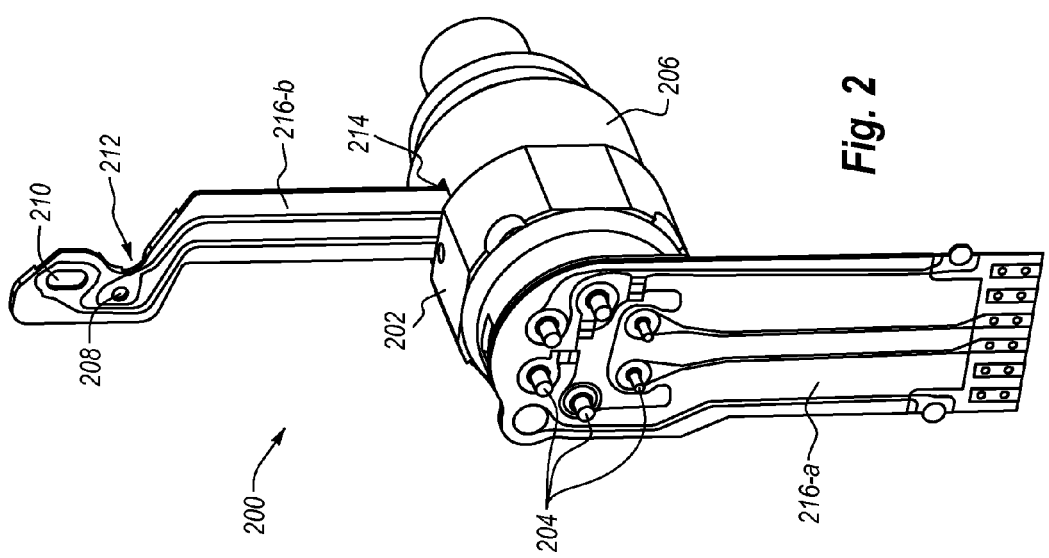
FIG. 2 is a perspective view of an example optical subassembly in a first configuration.

With continuing reference to FIG. 1C, and with reference now to FIG. 2, aspects of an example OSA 200 are disclosed. The OSA 200 and its flex circuit connectors are representative of the TOSA 112 and ROSA 114 and their flex circuit connectors. For example, the OSA 200 may be either a TOSA, such as the TOSA 112, or a ROSA, such as the ROSA 114, which are similar at least with respect to their outer housing. Various details, such as a number and size of leads or pins extending from the housings, may differ and, therefore, the particular OSA configuration shown in FIG. 2 is not intended to be limiting.

Generally, components in the OSA 200 are sensitive electrical components which require protection. As such, these electrical components may be manufactured in packaging assemblies, such as a transistor-outline header or transistor-outline package, referred to herein as a TO package or TO can. TO packages are often standardized to facilitate their incorporation into components such as transceivers. The TO packages protect the sensitive electrical components contained therein and electrically connect such components to external components, such as the PCB 120, via a flex circuit connector.

With respect to their construction, the TO packages may include a cylindrical base with a number of conductive leads extending completely through, and perpendicular to, the base. The base may be sized to fit within a specific TO standard size and lead configuration, examples of which include a TO-5 or TO-46. The leads may be hermetically sealed in the base to provide mechanical and environmental protection for the components contained in the TO package, and to electrically isolate the conductive leads from the metallic material of the base. One of the conductive leads may be a ground lead that may be electrically connected directly to the base.

As depicted in FIG. 2, the OSA 200 is constructed as a TO package including a first barrel 202, in which an optical component (not shown), such as an optical transmitter and/or optical receiver, is housed. The first barrel 202 may include a base, as described above, through which various pins or leads 204 extend. The OSA 200 also includes a second barrel 206 in which another component 207 (not shown, but visible in FIG. 4) is housed. The second barrel 206 may be attached to the first barrel 202 by a press fit and/or adhesive attachment means. For example, the first barrel 202 may include a nose piece (not shown) that is sized and configured to mate with a corresponding receptacle piece of the second barrel 206. In addition, the second barrel 206 includes a flange and a nose piece that are configured to optically connect the optical component disposed within the first barrel 202 with a fiber-ferrule (not shown). Thus, the flange and nose piece are functionally equivalent to the flange 128 and nose piece 130 of the TOSA 112 (or to the flange 136 and nose piece 138 of the ROSA 114, depending on whether the OSA 200 is a TOSA or a ROSA).

The component 207 housed in the second barrel 206 may be any component that is not easily or conveniently integrated within the first barrel 204. For example, if the first barrel 204 is a standard off-the-shelf TO package, it may lack sufficient space and/or leads for integration of additional components. In one embodiment the component 207 housed in the second barrel 206 is a variable optical attenuator (VOA). Another example of a component that may be housed in the second barrel 206 is a thermoelectric cooler (TEC).

Moreover, the component 207 housed in the second barrel 206 may interface or cooperate with the optical component of the first barrel 202 in one or more ways. For example, the component 207 may physically contact the optical component and may optically or electrically communicate with the optical component. Alternatively, the components may only communicate optically with a gap separating them.

Various types of components may be mounted on an inner side of the base of the first barrel 202. A cap within the first barrel 202 encloses the side of the base where such components are mounted, so as to form a chamber that helps prevent contamination or damage to those electrical device(s). The design of the TO package depends on the component being mounted on the base and the modular component to which the TO package will be connected. By way of example, in applications where the component mounted on the base is an optical component, the cap is at least partially transparent to allow an optical signal generated or received by the optical component to be transmitted to or from the TO package. Furthermore, the cap may include a lens for reshaping transmitted or received light. Such optical TO packages are also known as window cans.

The OSA 200 also includes one or more electrical interfaces, such as a primary flex circuit connector 216-*a* and a secondary flex circuit connector 216-*b*. (The designation "primary" and "secondary" is used merely for purposes of distinction and is not intended to imply a difference in degree of importance or priority.) The flex circuit connectors 216-*a* and 216-*b* (also referred to as flexible circuits or flexible circuit connectors) permit a wide range of motion during assembly of an optical transceiver in which the OSA 200 is integrated. In contrast, conventional electrical interfaces, such as a through-hole connection or leads straddling the OSA 200 on the outer edge of the PCB 120, do not permit a wide range of motion and are often more costly and complex due to specialized tooling or manual lead forming required to properly form the electrical interface.

The primary and secondary flex circuit connectors 216-*a* and 216-*b* are a patterned arrangement of printed wiring utilizing flexible base material. Flexible connectors 216-*a* and 216-*b* can comprise a waveguide design to confine and propagate electromagnetic waves along the flexible connector.

Figure 3:
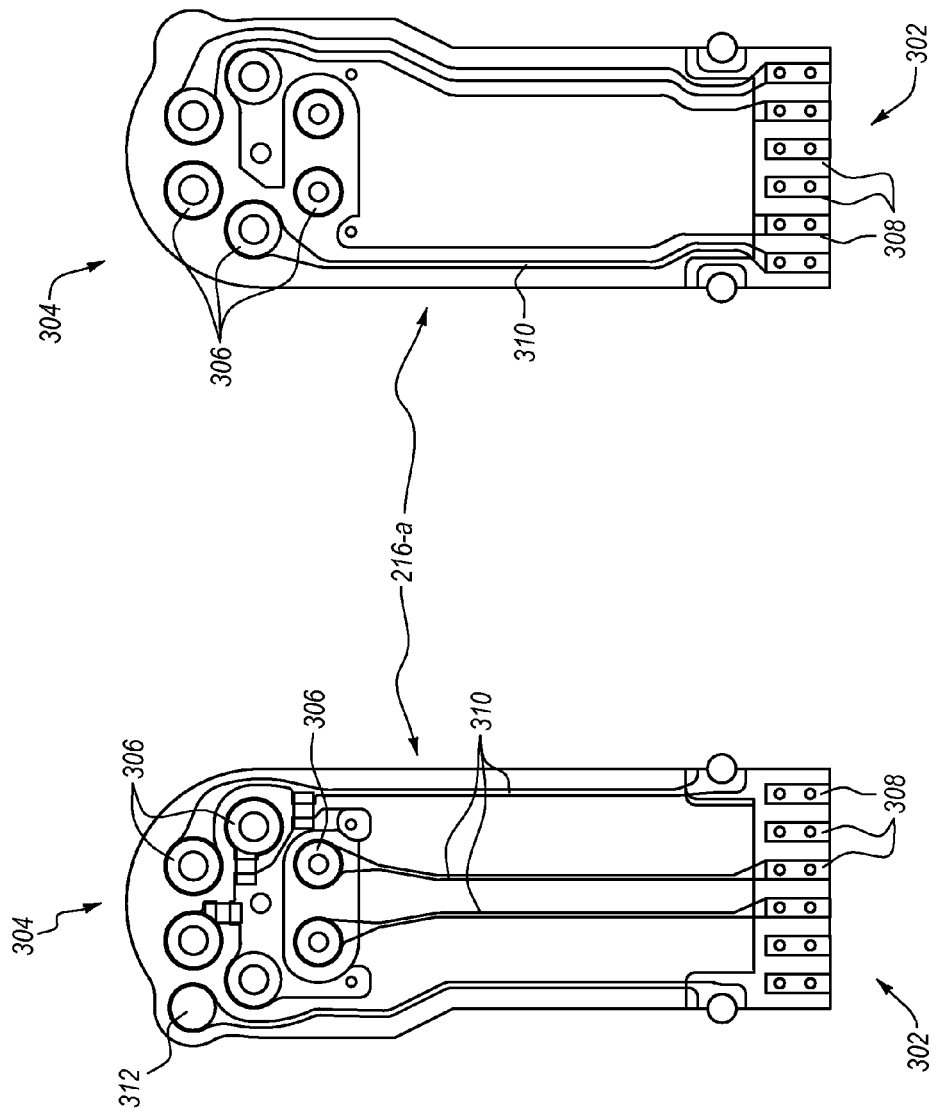
FIG. 3 is a side view of an example flex circuit connector of the optical subassembly in FIG. 2.

FIG. 3 shows the back and front sides of the primary flex circuit connector 216-*a*. In one embodiment, the flex circuit connectors 216-*a* and 216-*b* are double-layer flexible circuits, although it will be appreciated that one or both flexible circuits could be implemented as a single-layer flexible circuit. As shown in FIG. 3, the primary flexible circuit 216-*a* includes a first end 302 configured to connect to the PCB 120 or other suitable external component and an opposing second end 304 configured to connect to the leads 204 of OSA 200. The primary flexible circuit 216-*a* may be formed by sandwiching a base substrate layer between two conductive layers of patterned traces. Outer cap layers may also be included to cover each conductive layer of traces. In one configuration, the base layer is a dielectric material. The base layer can be constructed from a laminate material, for example, polyimide, polyester, LCP, Teflon, DuPont Pyralux® AP-8525 and DuPont Kapton® E, and the like. In one embodiment, the base layer is 0.001 inch thick.

The conductive layers can be formed of any suitable conductive material which can be formed into suitable ground and signal traces, for example, a metal such as, but not limited to, copper or a copper alloy. The conductive layers can be laminated onto the base layer and then etched to form the conductive patterns that form the appropriate traces, vias, and bonding pads. In one embodiment, signal traces and ground traces can be formed from the same material. However, the signal traces and ground traces could also be formed from different conductive materials.

The outer cap layers are made of, for example, a dielectric material. In one configuration, the cap layers can be a laminate material, such as, but not limited to, a polyimide. The base layer and cap layers can be constructed of the same or different materials. In one embodiment, the cap layers are each 0.001 inch thick. In one configuration, the bottom surface of each cap layer can include an adhesive to assist it in bonding to the exposed base layer and conductive layer. At least a portion of the base substrate layer and outer cap layers is formed from flexible materials.

FIG. 3 also illustrates an example pattern of vias 306 (for mating with leads 204), pads 308 (for mating with corresponding pads on the PCB 120), and traces 310 formed in the primary flex circuit connector 216-*a*. The traces 310 may include ground traces, power traces, and/or signal traces, including, e.g., traces for low speed data or for control signals. As shown in FIG. 3, the vias 306, pads 308, and traces 310 are formed in a spatial relationship so as to provide signal performance and controlled impedance throughout the transition from the PCB 120 to the primary flex circuit connector 216-*a* and the leads 204.

Figure 4:
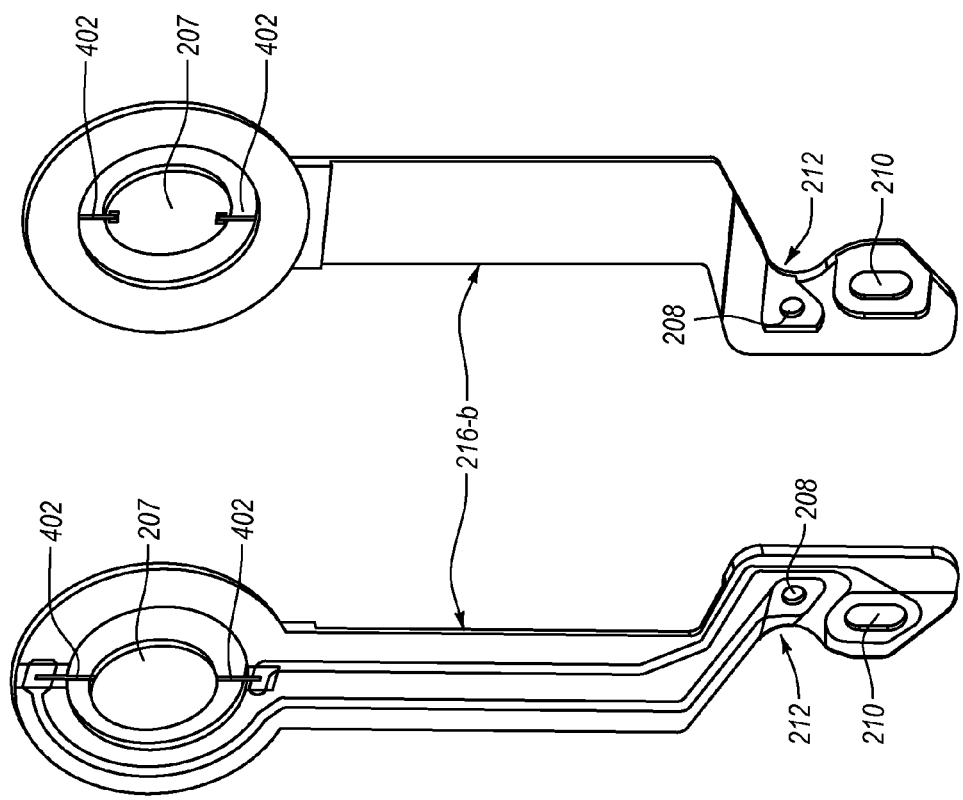
FIG. 4 is a side view of another example flex circuit connector of the optical subassembly in FIG. 2.

FIG. 4 shows the back and front sides of the secondary flex circuit connector 216-*b*. The secondary flex circuit connector 216-*b* may be constructed in a fashion similar to that of the primary flex circuit connector 216-*b*. For example, the secondary flex circuit connector 216-*b* may be a single-layer or double-layer flexible circuit having traces, vias, and pads. However, the secondary flex circuit connector 216-*b* is configured for connection, at a first end thereof, to the component 207 in the second barrel 206. For example, each of two wires 402 are soldered to corresponding exposed trace portions at the second end of the secondary flex circuit connector 216-*b* and to exposed contact pads on component 207 to provide a connection between the secondary flex circuit connector 216-*b* and the component 207. An opening 214 (depicted in FIGS. 2 and 5) from which the secondary flex circuit connector 216-*b* extends is provided in the second barrel 206 to provide physical access to the component 207 housed therein.

The component 207 is represented in FIG. 4 as having a disc-like shape, but may vary from that which is depicted. Furthermore, a holder (not shown) is disposed around the component 207 to fix its position with respect to other components in the OSA 200. A control signal s applied at exposed contact pads of the component 207 via the secondary flex circuit connector 216-*b*. For example, if the component 207 is a VOA, the control signal controls the transparency of the VOA with respect to light transmitted therethrough. Alternatively, if the component 207 is a TEC, the control signal controls the TEC's cooling power.

Figure 5:
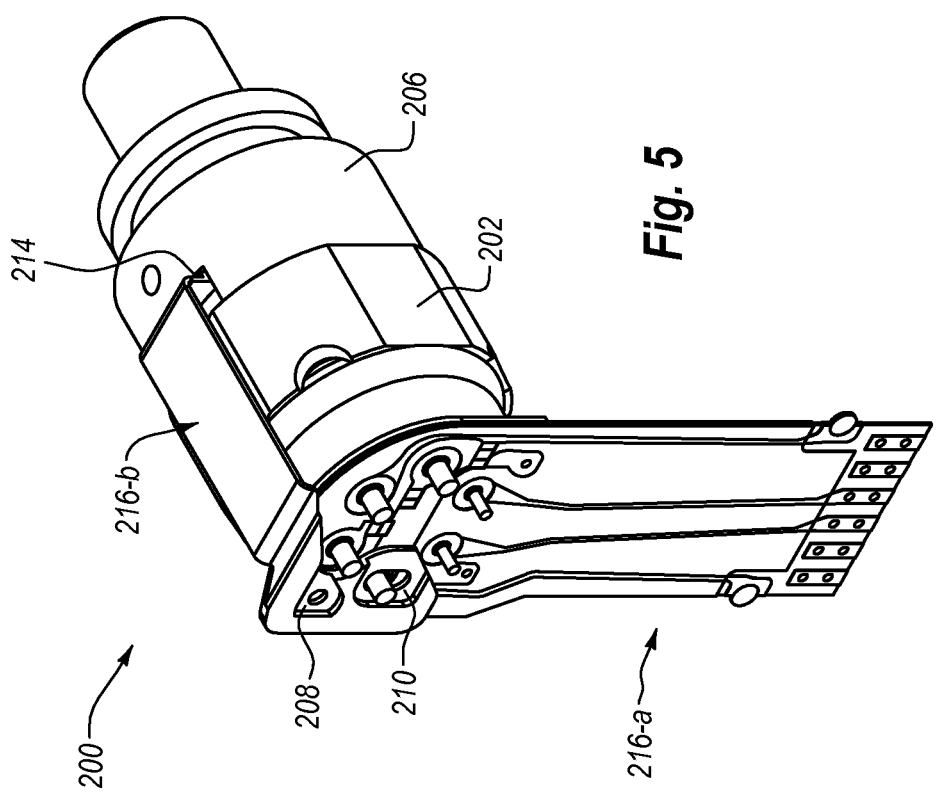
FIG. 5 is a perspective view of an example optical subassembly in a second configuration.

FIG. 5 shows the secondary flex circuit connector 216-*b* in a folded state, in contrast to the unfolded state shown in FIG. 2. Thus, as shown in FIG. 5, the secondary flex circuit connector 216-*b* is sufficiently flexible to permit its second end to physically contact the second end 304 of the primary flex circuit connector 216-*a*. For example, with reference to FIGS. 3 and 5, a first exposed portion of a trace at the second end of the secondary flex circuit connector 216-*b* physically contacts a pad 312 on the second end 304 of the primary flex circuit connector 216-a and a second exposed portion of a trace at the second end of the secondary flex circuit connector 216-b physically contacts one of the leads 204 (e.g., a ground lead). The traces exposed at the second end of the secondary flex circuit connector 216-b run parallel through the secondary flex circuit connector 216-b toward the first end thereof and into the opening 214. The two exposed trace portions at the second end of the secondary flex circuit connector 216-b are electrically connected to the exposed pad 312 and to the lead 204 below the pad 312, respectively. The electrical connection may be made using, for example, solder, or other suitable electrical connection means.

Vias 208 and 210, and corresponding exposed portions of the traces around the vias 208 and 210, are formed in the secondary flex circuit connector 216-b to facilitate application of solder and to ensure a reliable electrical connection to the traces of the secondary flex circuit connector 216-b. In addition, the second end of the secondary flex circuit connector 216-b includes a substantially c-shaped curve 212, as shown in FIGS. 2 and 4, to avoid contact with other leads 204.

The pad 312 of the primary flex circuit connector 216-a (depicted in FIG. 3) is electrically connected to a trace extending to the first end 302 of the primary flex circuit connector 216-a, which is in turn electrically connected to the PCB 120. Consequently, the component 207 housed in the second barrel 206 can send and/or receive signals to and/or from a microprocessor or other component on the PCB 120 via the pad 312. For example, if the component 207 in the second barrel 206 is a variable optical attenuator, a control signal from a controller on the PCB 120 can control the degree of attenuation introduced by the variable optical attenuator. Alternatively, if the component 207 is a thermoelectric cooler, the control signal can control a degree of cooling provided by the thermoelectric cooler. A ground signal may be provided to the component 207 via the trace in the secondary flex circuit connector 216-b that is connected to the lead 204. The ground signal may be provided to prevent the control signal from floating. Moreover, although the example embodiment shows use of only two connecting traces in the secondary flex circuit connector 216-b, it will be appreciated that the secondary flex circuit connector 216-b can include a single trace or more than two traces in accordance with the particular interface requirements of the component 207 housed in the second barrel 206.

In one embodiment, in order to reduce packaging size, bulk, and signal loss, among other things, the length of the secondary flex circuit connector 216-b may be tailored to span the distance between the access opening 214 in the second barrel 206 and the second end 304 of the primary flex circuit connector 216-a with substantially no slack. Alternatively, if packaging size is of low priority and/or signal loss is negligible, the length of the secondary flex circuit connector 216-b may be any suitable length and may, in fact, extend to and physically contact the PCB 120 without physically contacting the primary flex circuit connector 216-a at any point.

Figure 6:
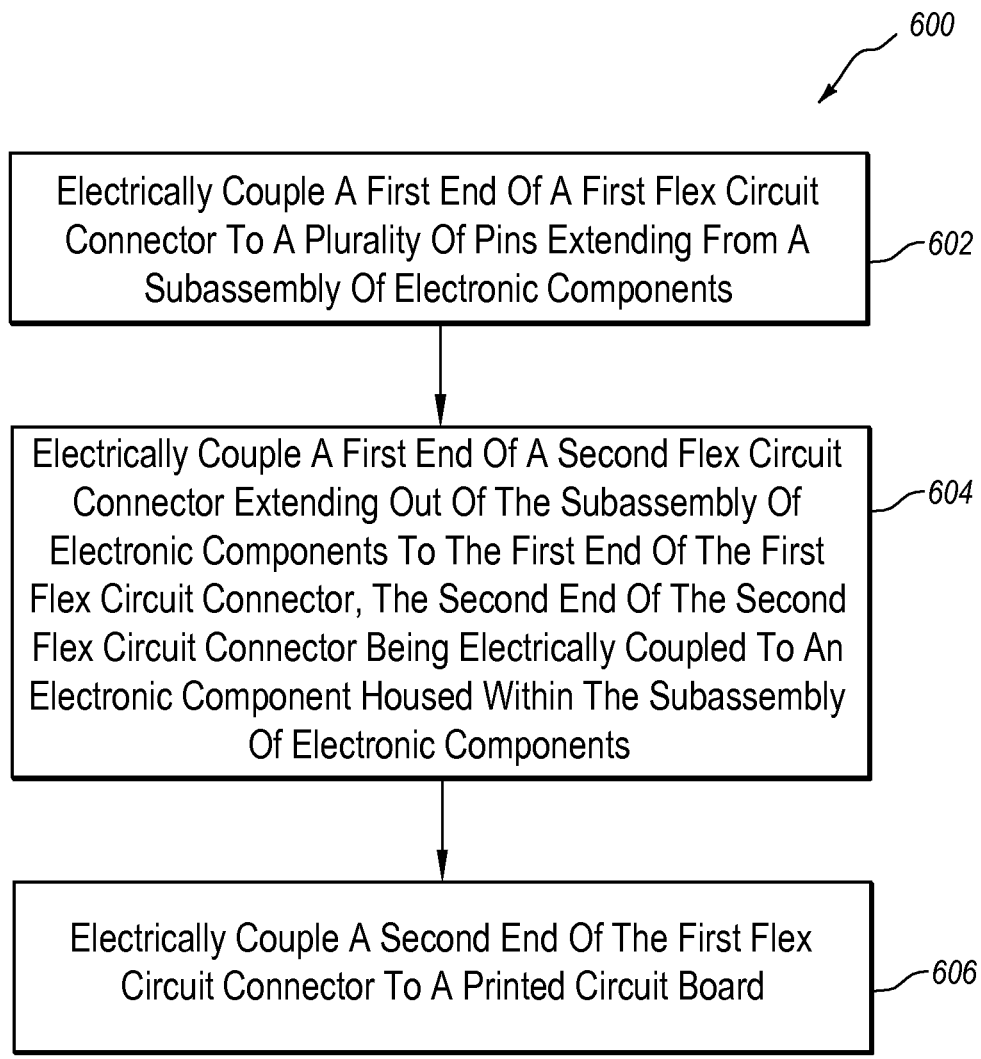
FIG. 6 is a flowchart view of an example method of assembling the optical subassembly in FIG. 5.

FIG. 6 shows an example method 600 for assembling the OSA 200. Method 600 starts by first electrically coupling the second end 304 of the primary flex circuit connector 216-a to the pins 204 extending from the OSA 200 (stage 602). Next, an end of the secondary flex circuit connector 216-b that extends out of OSA 200 is electrically coupled to the second end 304 of the primary flex circuit connector 216-a (stage 604). (The other end of the secondary flex circuit connector 216-b is electrically coupled to the component 207 housed within the OSA 200.) Finally, the first end 302 of the primary flex circuit connector 216-a is electrically coupled to the PCB 120 (stage 606).

The act of electrically coupling performed in the various stages of the method 600 includes, in one example embodiment, an act of soldering exposed pads or contacts to form a physical and electrical connection. Moreover, various other versions of the methods 600 may be implemented including versions in which various stages are modified, omitted, or new stages added or in which the order of the depicted stages differs.

The foregoing detailed description of various embodiments is provided by way of example and not limitation. For example, other embodiments are contemplated in which three or more flex circuit connectors are used. Furthermore, where a third flex circuit connector is used, it may extend between a third component and one or more of the leads 204 and/or pads on the primary flex circuit connector 216-a, like the secondary flex circuit connector 216-b. Additional flex circuit connectors and corresponding components may be added to the OSA 200 in a similar manner. Alternatively, the second flex circuit connector 216-b may be modified to provide an electrical interface between one or more traces of the primary flex circuit connector 216-a and one or more corresponding traces of a third flexible connector. Additional flex circuit connectors may be added in like manner, each interfacing with the PCB 120 through another flex circuit connector that is closer to the PCB 120. In another example embodiment the components housed with the barrels 202 and 206 are switched. For example, the component housed within the second barrel 206 may be an optical component, such as an optical transmitter or receiver, whereas the component housed within the first barrel 202 may be an electrical component, such as a VOA or TEC.

Furthermore, although the embodiments are described above with reference to a TO package including the barrels 202 and 204, the TO package is shown merely as an example. Other forms of housings or no housings at all may instead be used. Moreover, embodiments of the invention are not limited to use in optical transceivers and subassemblies. Thus, for example, the optical component housed in the barrel 202 may alternatively be an electrical component having no optical input or output.

Accordingly, the present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. An electronic module comprising:
   a first component comprising an optical transmitter or an optical receiver;
   a second component comprising a variable optical attenuator or a thermo electric cooler;
   a housing to house the first and second components;
   a first flex circuit connector electrically connecting to the first component and extending from the electronic module; and
   a second flex circuit connector electrically connecting to the second component and extending from the electronic module and physically attached to the housing between a first end of the housing and a second end of the housing.

2. The electronic module of claim 1, wherein the first flex circuit connector is coupled to at least one of a plurality of leads extending out of the housing.

3. The electronic module of claim 2, wherein the second flex circuit connector is coupled to at least one of the plurality of leads at a first end thereof and extends out of an opening in the housing at a second end thereof.

4. The electronic module of claim 2, wherein the leads are disposed at the first end of the housing and an optical fiber receptacle is disposed at the second end of the housing.

5. The electronic module of claim 4, wherein the first flex circuit connector is physically attached to the leads.

6. The electronic module of claim 1, wherein a first end of the second flex circuit connector extends out of an opening in the housing that provides access to the second component.

7. The electronic module of claim 6, wherein a second end of the second flex circuit connector is physically attached to an exposed pad on the first flex circuit connector.

8. The electronic module of claim 7, wherein the exposed pad is at a first end of the first flex circuit connector and has an electrical conductor extending therefrom to a second end of the first flex circuit connector.

9. An optical transceiver comprising:
a printed circuit board (PCB);
an optical subassembly (OSA); and
a plurality of flex circuit connectors electrically coupling the OSA to the PCB, the OSA including a plurality of components each coupled to a corresponding one of the plurality of flex circuit connectors;
wherein a first one of the plurality of flex circuit connectors includes an exposed pad and a second one of the plurality of flex circuit connectors is physically attached to the exposed pad.

10. The optical transceiver of claim 9, wherein a first one of the plurality of components is one of an optical transmitter and an optical receiver.

11. The optical transceiver of claim 10, wherein a second one of the plurality of components is a variable optical attenuator.

12. The optical transceiver of claim 10, wherein a second one of the plurality of components is a thermo electric cooler.

13. The optical transceiver of claim 9, wherein the OSA comprises a housing to house the plurality of components.

14. The optical transceiver of claim 13, wherein one of the plurality of flex circuit connectors is coupled to at least one of a plurality of leads at a first end thereof and extends out of an opening in the housing at a second end thereof.

15. The optical transceiver of claim 13, wherein the first one of the plurality of flex circuit connectors is coupled to at least one of a plurality of leads extending out of the housing.

16. The optical transceiver of claim 15, wherein the leads are disposed at a first end of the housing and an optical fiber receptacle is disposed at a second end of the housing.

17. The optical transceiver of claim 13, wherein a first end of the second one of the plurality of flex circuit connectors extends out of an opening of the housing providing access to a corresponding one of the components and a second end of the second one of the plurality of flex circuit connectors is physically attached to the exposed pad.

18. The optical transceiver of claim 17, wherein the exposed pad is at a first end of the first one of the plurality of flex circuit connectors and has an electrical conductor extending therefrom to a second end of the first one of the plurality of flex circuit connectors.

19. An optical subassembly (OSA) comprising:
one or more housings;
an optoelectronic transducer at least partially housed within the one or more housings;
an interfacing component configured to interface with the optoelectronic transducer and at least partially housed within the one or more housings;
a first flex circuit connector electrically connected to the optoelectronic transducer and extending from the one or more housings; and
a second flex circuit connector electrically connected to the interfacing component and extending from the one or more housings,
wherein the interfacing component comprises a thermoelectric cooler.

20. The OSA of claim 19, wherein the optoelectronic transducer comprises an optical transmitter.

21. The OSA of claim 19, wherein the optoelectronic transducer comprises an optical receiver.

22. The OSA of claim 19, wherein the one or more housings comprise:
a first barrel configured to house the optoelectronic transducer and from which the first flex circuit connector extends; and
a second barrel coupled to the first barrel and configured to house the interfacing component and from which the second flex circuit connector extends.

23. The OSA of claim 19, wherein the first flex circuit and the second flex circuit are configured to be electrically coupled to a printed circuit board (PCB) of an optical transceiver.

* * * * *